United States Patent
Gopalan et al.

(10) Patent No.: US 6,794,269 B1
(45) Date of Patent: Sep. 21, 2004

(54) METHOD FOR AND STRUCTURE FORMED FROM FABRICATING A RELATIVELY DEEP ISOLATION STRUCTURE

(75) Inventors: Prabhuram Gopalan, Fremont, CA (US); Biju Parameshwaran, Union City, CA (US); Krishnaswamy Ramkumar, San Jose, CA (US); Hanna Bamnolker, Cupertino, CA (US); Sundar Narayanan, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/324,989

(22) Filed: Dec. 20, 2002

(51) Int. Cl.[7] .............................................. H01L 21/76
(52) U.S. Cl. ....................... 438/427; 438/435; 438/437
(58) Field of Search ................................ 438/427, 435, 438/437

(56) References Cited

U.S. PATENT DOCUMENTS

| | | | | |
|---|---|---|---|---|
| 5,536,675 A | * | 7/1996 | Bohr .......................... | 438/427 |
| 5,994,200 A | * | 11/1999 | Kim ........................... | 438/425 |
| 6,127,241 A | * | 10/2000 | Rha ........................... | 438/437 |
| 6,399,449 B1 | * | 6/2002 | Matsumoto .................. | 438/296 |
| 6,461,934 B2 | * | 10/2002 | Nishida et al. .............. | 438/424 |
| 6,596,607 B2 | * | 7/2003 | Ahn ........................... | 438/424 |
| 2001/0036705 A1 | * | 11/2001 | Nishida et al. .............. | 438/296 |
| 2003/0013272 A1 | * | 1/2003 | Hong et al. .................. | 438/437 |

* cited by examiner

*Primary Examiner*—Long Pham
(74) *Attorney, Agent, or Firm*—Kevin L. Daffer; Mollie P. Jellang; Conley Rose P.C.

(57) ABSTRACT

A method is provided which includes forming a deep isolation structure within a semiconductor topography. In some cases, the method may include forming a first isolation structure within a semiconductor layer and etching an opening within the isolation structure to expose the semiconductor layer. In addition, the method may include etching the semiconductor layer to form a trench extending through the isolation structure and at least part of the semiconductor layer. In some cases, the method may include removing part of a first fill layer deposited within the trench such that an upper surface of the fill layer is below an upper portion of the trench. In such an embodiment, the vacant portion of the trench may be filled with a second fill layer. In yet other embodiments, the method may include planarizing the first fill layer within the trench and subsequently oxidizing an upper portion of the fill layer.

19 Claims, 4 Drawing Sheets

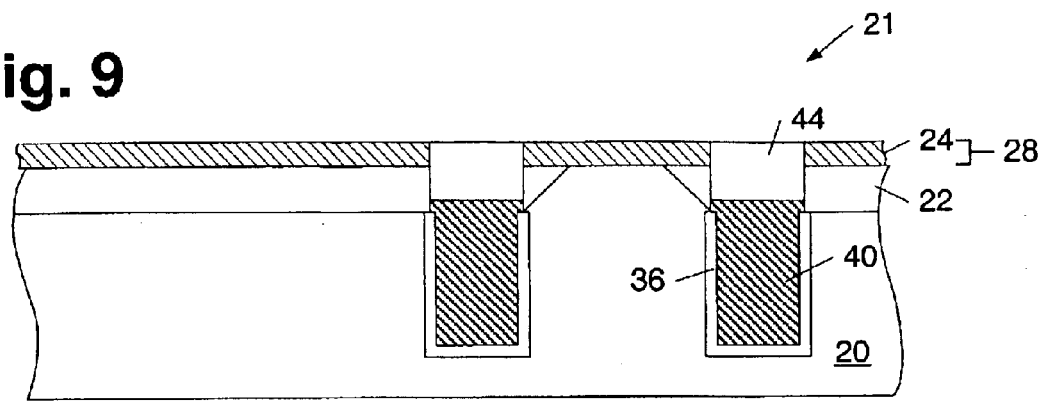
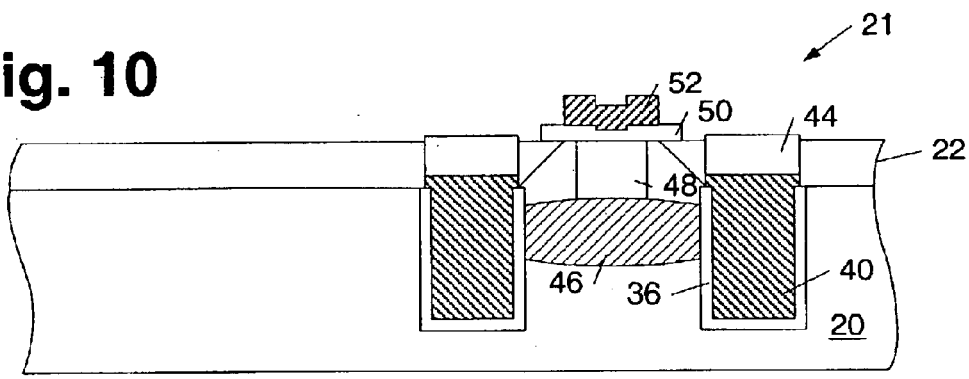
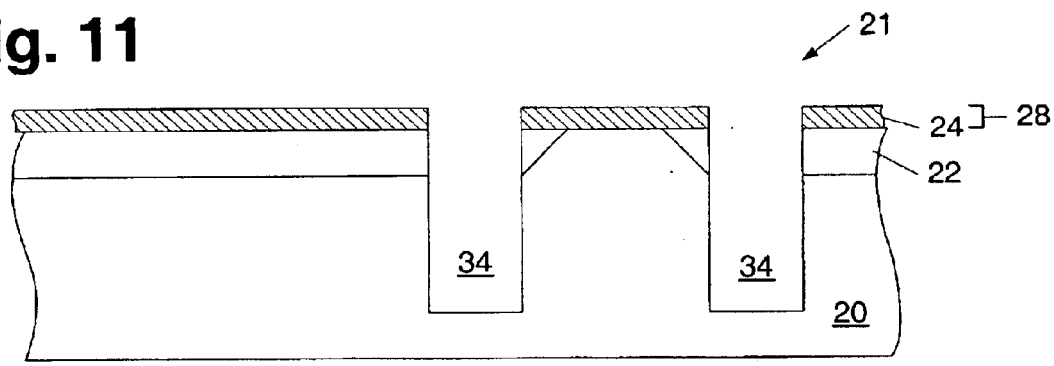
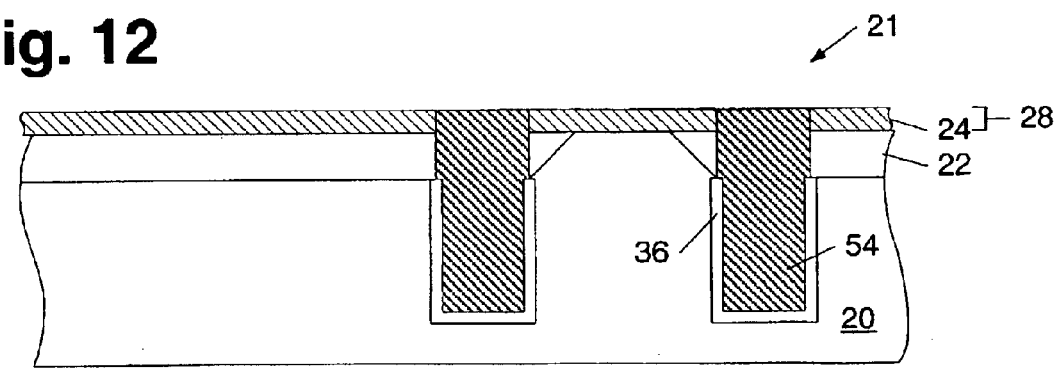

METHOD FOR AND STRUCTURE FORMED FROM FABRICATING A RELATIVELY DEEP ISOLATION STRUCTURE

BACKGROUND OF THE INVENTION

1. Field of the Invention

This invention relates to semiconductor device manufacturing, and more particularly, to an improved method for fabricating an isolation structure.

2. Description of the Related Art

The following descriptions and examples are not admitted to be prior art by virtue of their inclusion within this section.

Numerous isolation structures are formed within and/or upon a semiconductor substrate during the fabrication of an integrated circuit to separate the active devices of the circuit. Consequently, isolation structures are sometimes referred to as the "field" or "isolation" regions of a device, while the device areas are sometimes referred to as the "active" regions of a device. One popular isolation structure fabrication technology includes the process of locally oxidizing silicon ("LOCOS"). In general, LOCOS includes oxidizing portions of a silicon-based substrate in regions arranged adjacent to portions of the substrate designated for active devices of a circuit. There are several problems associated with LOCOS, however. In particular, field oxides formed from LOCOS generally grow laterally as well as vertically, forming an extension, sometimes referred to as a "bird's-beak structure." In many instances, a bird's-beak structure can unacceptably encroach into an active region, affecting the performance of the device. Furthermore, the thickness variation of field oxide across the semiconductor topography may cause large elevational disparities between field and active regions of the device. Such topographical disparities can cause planarity problems which become more severe as critical dimensions shrink. In particular, thermal oxide growth is significantly thinner in small field regions (i.e., field areas of small lateral dimension) relative to large field regions. Such relatively thin field-oxide thicknesses produce problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process." The shallow trench process is particularly suited for isolating densely spaced active devices having field regions less than one micron in lateral dimension. Such a trench process involves etching a silicon substrate surface to a relatively shallow depth, e.g., between approximately 0.2 microns and approximately 0.5 microns, and then refilling the shallow trench with a deposited dielectric. The trench is then planarized to complete the formation of the isolation structure. Such a trench process eliminates bird's-beak and thin field-oxide growth problems. In addition, the isolation structure is fully recessed, offering at least a potential for a planar surface.

While the shallow trench isolation process has many advantages over LOCOS, such a trench process also has problems. For example, in some cases, a high level of substrate capacitance may be generated in a device that has layers within its active regions which are arranged elevationally below the shallow trench isolation structures of the field oxide regions. For example, a high level of substrate capacitance may be generated during the fabrication of a bipolar transistor which has a buried layer arranged below the transistor. Such an increase in substrate capacitance may be generated by the diffusion of impurity species during high temperature processing steps of the fabrication sequence. In particular, impurities from the layers of the active regions may diffuse into portions of the substrate arranged between such active region layers and the shallow isolation structures, increasing the substrate capacitance of the device. In general, high substrate capacitance may undesirably alter the performance of the device (i.e., reduce the maximum frequency of operation of the device).

Accordingly, it would be advantageous to develop a method for fabricating a device which prevents or reduces the generation of high substrate capacitance within a device. Alternatively stated, it would be beneficial to develop a fabrication method which inhibits the increase of substrate capacitance between layers of the active regions and field regions of the device. Such a method may additionally prevent or reduce the formation of bird's beak and/or thin field oxide growth within field regions of the device. In addition, it would be advantageous for such a fabrication method to minimize the number of additional high temperature process steps needed to form such a device.

SUMMARY OF THE INVENTION

The problems outlined above may be in large part addressed by a method for processing a semiconductor topography. In particular, a method is provided which includes forming a relatively deep isolation structure within a semiconductor topography. In some cases, the method may include forming an isolation structure having a relatively shallow depth within a semiconductor layer of the semiconductor topography and etching an opening within the isolation structure such that an underlying portion of the semiconductor layer is exposed. In addition, the method may include etching the underlying portion of the semiconductor layer to form a trench extending through the isolation structure and at least part of the semiconductor layer. In some cases, the method may include forming a hardmask layer upon the semiconductor layer prior to etching the opening within the isolation structure having the shallow depth such that the trench extends through the hardmask layer. Such a hardmask layer may include a single layer of material, such as silicon dioxide or silicon nitride, in some cases. Alternatively, the hardmask layer may include multiple layers of materials. For example, in some cases, the hardmask layer may include a lower layer of silicon nitride and an upper layer of silicon dioxide. In yet other embodiments, the method may not include forming a hardmask layer prior to etching the opening within the isolation structure having the shallow depth.

In some cases, the method may include forming an oxide liner layer along the part of the semiconductor layer comprising the trench. In some cases, the method may additionally include depositing a nitride liner layer upon such an oxide liner layer. More specifically, the method may include depositing a nitride liner layer within the trench and adjacent regions of the semiconductor topography. In yet other embodiments, the method may not include depositing a nitride liner layer within the trench. In either case, the method may include depositing a first fill layer within the trench. In some embodiments, the method may include removing part of the first fill layer such that an upper surface of the first fill layer is substantially coplanar with an upper surface of the semiconductor topography arranged adjacent to the trench. For example, the method may include removing part of the first fill layer such that an upper surface of the first fill layer is substantially coplanar with an upper surface of the hardmask layer. In some cases, the method may include removing an upper portion of the hardmask layer prior to the step of depositing the first fill layer. In yet other embodiments, the method may not include removing an upper portion of the hardmask layer prior to the step of depositing the first fill layer. In any case, the method may include oxidizing an upper portion of the first fill layer arranged within the trench.

In yet other embodiments, the method may include removing part of the first fill layer such that an upper surface of the first fill layer is below an upper portion of the trench. More specifically, the method may include etching back the first fill layer such that an upper surface of the first fill layer is below an upper portion of the trench. In such an embodiment, the method may include forming a second layer within the upper portion of the trench. Alternatively stated, the method may include depositing a second fill layer upon the first fill layer. In some embodiments, the method may include removing part of the second fill layer such that an upper surface of the second fill layer is substantially coplanar with a hardmask layer arranged adjacent to the trench. Such a removal process may include polishing and/or etching the second fill layer.

Consequently, a semiconductor topography is contemplated herein which includes a first isolation structure recessed within a semiconductor layer of the semiconductor topography and a second isolation structure recessed within a portion of the first isolation structure and an underlying portion of the semiconductor layer. In some cases, the second isolation structure may include an upper portion and a lower portion having different material compositions than each other. For example, in some cases, the lower portion may include amorphous silicon or polysilicon. On the other hand, the upper portion may not include either of such silicon materials. Rather, the upper portion may include a dielectric material, such as silicon dioxide, silicon nitride, and/or silicon oxynitride, for example. In a preferred embodiment, the upper portion may include a material with substantially different etching or polishing characteristics than the lowermost material included in the hardmask layer arranged adjacent to the trench. In this manner, the hardmask layer may be used as an etch stop or polish stop layer. In some cases, the lower portion of the second isolation structure may additionally include an oxide liner layer. In some embodiments, the lower portion and the upper portion may additionally include a nitride liner layer as well. In any case, the upper portion of the second isolation structure may include a thickness substantially similar to a thickness of the first isolation structure in some embodiments. Alternatively, the upper portion of the second isolation structure may include a thickness substantially different than the thickness of the first isolation structure.

There may be several advantages to forming an isolation structure in the manner described above. For example, a device with minimal substrate capacitance may be formed. In particular, an isolation structure may be formed within a device such that the substrate capacitance of the device may not be substantially increased during the fabrication of the device. In addition, the method may not add a significant the number of high temperature process steps during the fabrication of the device. In this manner, diffusion of impurities arranged within the active regions of the device may not increase. Moreover, the formation of bird's beak structures and thin field-oxide regions may be minimized. As a result, the reliability of a device formed from the method described herein may be higher than a device formed from conventional techniques. In addition, a semiconductor topography having a substantially planar upper surface may be formed. More specifically, the isolation structures formed from the method described herein may have substantially small and uniform step heights. In this manner, additional structures and layers may be formed within design specifications of the device.

BRIEF DESCRIPTION OF THE DRAWINGS

Other objects and advantages of the invention will become apparent upon reading the following detailed description and upon reference to the accompanying drawings in which:

FIG. 9 depicts a partial cross-sectional view of the semiconductor topography in which an upper portion of the second fill layer and an upper portion of the hardmask layer are removed subsequent to the deposition of the second fill layer in FIG. 8;

FIG. 10 depicts a partial cross-sectional view of the semiconductor topography in which a lower portion of the hardmask layer is removed and a bipolar transistor is formed subsequent to the removal of the upper portion of the second fill layer in FIG. 9;

FIG. 11 depicts a partial cross-sectional view of the semiconductor topography, in an alternative embodiment, in which an upper portion of the hardmask layer is removed subsequent to the formation of the trenches in FIG. 4;

FIG. 12 depicts a partial cross-sectional view of the semiconductor topography in which a fill layer is deposited and planarized within the trenches subsequent to the removal of the upper portion of the hardmask layer in FIG. 11;

Figure 1:
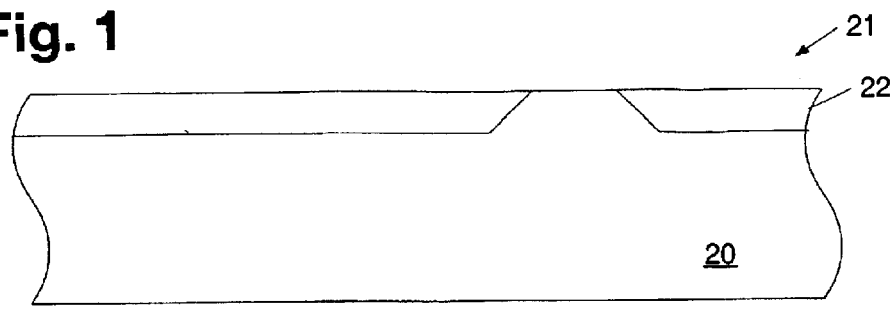
FIG. 1 depicts a partial cross-sectional view of a semiconductor topography in which isolation structures having shallow depths are formed within a semiconductor layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of a method for processing a semiconductor topography is shown in FIGS. 1–15. In particular, exemplary embodiments of a method are provided which include forming relatively deep isolation structures within a semiconductor topography. As used herein, "deep isolation structures" may refer to isolation structures having a depth greater than approximately 3.0 microns. Conversely, "shallow isolation structures" may refer to isolation structures having a depth less than approximately 3.0 microns. FIG. 1 depicts semiconductor topography 21 having isolation structures 22 formed within semiconductor layer 20. In general, isolation structures 22 may be formed by etching trenches within semiconductor layer 20 with relative shallow depths. For example, in some embodiments, the trenches may be formed with a depth between approximately 0.2 microns and approximately 3.0 microns, or more specifically between approximately 0.2 microns and approximately 1.0 microns or between approximately 1.0 microns and approximately 3.0 microns. In any case, the trenches may be filled with a dielectric, such as silicon dioxide, and planarized to be substantially coplanar with adjacent portions of semiconductor layer 20 as shown in FIG. 1.

In some embodiments, semiconductor layer 20 may be a silicon-based substrate such as a monocrystalline silicon, silicon-germanium, silicon-on-insulator, or silicon-on-sapphire substrate. In such an embodiment, semiconductor layer 20 may be doped either n-type or p-type. Alternatively, semiconductor layer 20 may be substantially undoped. In yet other embodiments, semiconductor layer 20 may include structures and layers formed upon a semiconductor substrate. The structures and layers may include, but are not limited to, dielectric layers, gate structures, contacts, vias, and interconnect lines. In such an embodiment, the upper surface of semiconductor layer 20 may include a silicon-based layer, such as undoped polysilicon, for example. In some cases, semiconductor layer 20 may further include a pad oxide layer formed upon its upper surface in regions of semiconductor topography 21 which do not include isolation structures 22. Such regions of semiconductor topography 21 may be designated for the subsequent formation of active devices as described in more detail below in reference to FIG. 10. In general, the pad oxide layer may serve to reduce inherent stresses between an overlying layer and semiconductor layer 20. For example, the pad oxide layer may serve to reduce the stresses between semiconductor layer 20 and a subsequently deposited nitride layer described in more detail in reference to FIG. 2. Typically, such a pad oxide layer may have a thickness between approximately 15 angstroms and approximately 250 angstroms and, therefore, is not shown in FIGS. 1–15 to simplify the illustration of the method described herein.

Figure 2:
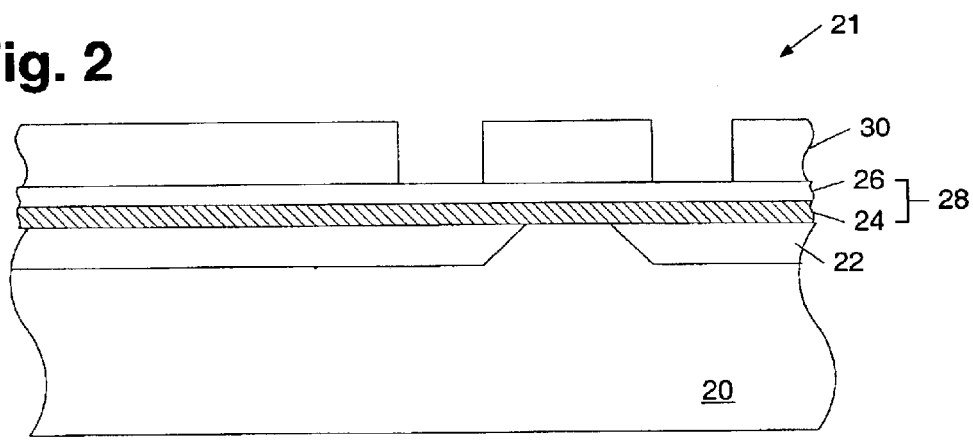
FIG. 2 depicts a partial cross-sectional view of the semiconductor topography in which a hardmask layer and a patterned resist layer are formed subsequent to the isolation structure formation of FIG. 1.

Turning to FIG. 2, hardmask layer 28 may be formed upon isolation structures 22 and exposed portions of semiconductor layer 20. In general, hardmask layer 28 may include one or more layers adapted to protect underlying portions of semiconductor topography 21 during subsequent processing. For example, hardmask layer 28 may include one or more layers adapted to protect portions of isolation structures 22 and semiconductor layer 20 during the removal of material deposited upon hardmask layer 28 in subsequent processing steps. An explanation of such use of hardmask layer 28 is described in more detail below in reference to FIGS. 7 and 9. As shown in FIG. 2, hardmask layer 28 may include two layers in some embodiments. In particular, FIG. 2 shows hardmask layer 28 including lower layer 24 and upper layer 26. In an alternative embodiment, hardmask layer 28 may only include a single layer, such as lower layer 24 or upper layer 26. In yet another embodiment, hardmask layer 28 may include more than two layers. In such an embodiment, hardmask layer 28 may include additional layers interposed between, above, or below lower layer 24 and/or upper layer 26.

In any case, hardmask layer 28 may include one or more layers having different polishing and/or etching characteristics than the one or more materials deposited in the subsequently formed trenches of semiconductor topography 21. An example of a distinction in etching characteristics between two such materials is described in more detail below in reference to FIG. 7 which includes removing portions of fill layer 38 using upper layer 26 as an etch stop layer. An example of a distinction in polishing characteristics between two materials is described in more detail below in reference to FIG. 9 which includes removing portions of fill layer 42 using upper layer 24 as a polish stop layer. In some embodiments, hardmask layer 28 may further include one or more layers having substantially similar polishing and/or etching characteristics as the one or more materials deposited in the subsequently formed trenches of semiconductor topography 21. An example of such an embodiment is described in more detail below with reference to FIGS. 8 and 9, in which fill layer 42 is deposited upon upper layer 26. In such an embodiments, fill layer 42 has substantially similar etching and/or polishing characteristics as upper layer 26.

Consequently, hardmask layer 28 may include any conductive or dielectric material, such as aluminum, copper, titanium, tungsten, doped polysilicon, silicon dioxide, silicon nitride, silicon oxynitride, and/or any layer comprising such materials. For example, in some embodiments, hardmask layer 28 may have lower layer 24 including silicon nitride and upper layer 26 including silicon dioxide. In yet other embodiments and as noted above, hardmask layer 28 may only include a single layer such as silicon nitride, for example. It is noted that the embodiments recited herein are merely used for reference and the materials of hardmask layer 28 are not restricted to such materials. Other conductive or dielectric materials known in the semiconductor fabrication industry having different etching and/or polishing characteristics than the one or more materials used to fill subsequently formed trenches of semiconductor topography 21 may also or alternatively be used for hardmask layer 28 as well.

In any case, the thickness of hardmask layer 28 may, in general, be between approximately 500 angstroms and approximately 10,000 angstroms. More specifically, each of the one or more layers of hardmask layer 28 may be between approximately 500 angstroms and approximately 7500 angstroms. For example, in some embodiments, lower layer 24 and/or upper layer 26 may each include a thickness between approximately 500 angstroms and approximately 7500 angstroms, or more specifically between approximately 500 angstroms and 3000 angstroms. Larger or smaller thicknesses for lower layer 24 and/or upper layer 26 may be appropriate, however, depending on the materials used for such layers and the design specifications of the device.

In addition to the formation of hardmask layer 28 upon semiconductor topography 21 resist 30 may be formed above hardmask layer 28 as shown in FIG. 2. In general, resist 30 may include a photoresist, such as a deep ultraviolet resist, an I-line resist, a G-line resist, or another resist, such as an e-beam resist or an x-ray resist. In this manner, resist 30 may be patterned as shown in FIG. 2. In some embodiments, resist 30 may further include an antireflective material which aids in producing a profile within resist 30 that meets the design specifications of the device. In general, the thickness of resist 30 may be between approximately 5000 angstroms and approximately 10,000 angstroms. Larger or smaller thicknesses of resist 30, however, may be used depending on the parameters of the fabrication process.

Although FIG. 2 illustrates the formation of three patterned structures from resist 30, any number of resist pattern structures may be formed across semiconductor topography 21 in accordance with design specifications of the device. In addition, the patterned resist structures of resist 30 may be formed with various dimensions and spacings therebetween in accordance with the design specifications of the device. For example, resist 30 may be patterned such that exposed portions of semiconductor topography 21 adjacent to the patterned structures of resist 30 may have a width between approximately 1.0 micron and approximately 5.0 microns. Larger or smaller widths of semiconductor topography 21 may be exposed during the patterning of resist 30, however, depending on the design specifications of the device. In general, resist 30 may be patterned such that relatively deep isolation structures may be fabricated in close proximity to subsequently formed active devices of the circuit such that the substrate capacitance of the devices may be minimized.

Figure 3:
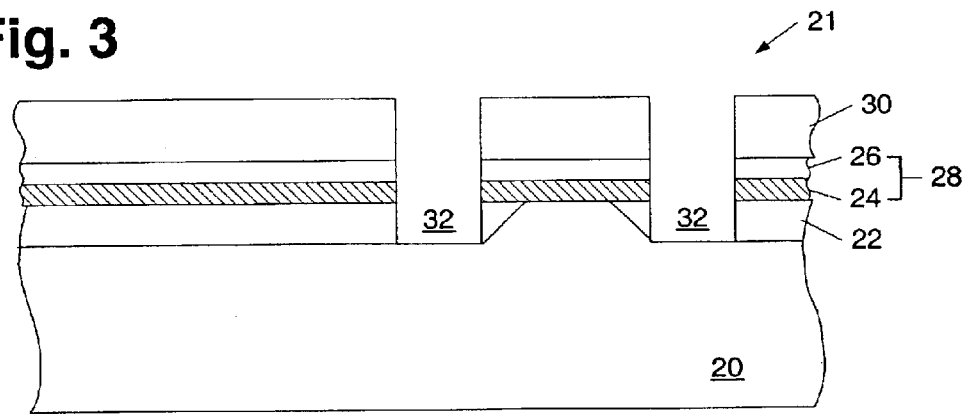
FIG. 3 depicts a partial cross-sectional view of the semiconductor topography in which openings are formed within the isolation structures subsequent to the formation of the patterned resist layer in FIG. 2.

After patterning resist 30, exposed portions of semiconductor topography 21 may be etched as shown in FIG. 3. In particular, exposed portions of hardmask layer 28 and isolation structures 22 may be etched using lithography techniques known in the semiconductor fabrication industry to form openings 32. As shown in FIG. 3, exposed portions of semiconductor topography 21 may be etched such that an underlying portion of semiconductor layer 20 is exposed. In general, the depth of openings 32 may be defined by the thickness between the upper surface of hardmask layer 28 and the exposed surface of semiconductor layer 20. Therefore, the depth of openings 32 may depend on the thickness of hardmask layer 28 and isolation structures 22. For example, the depth of openings 32 may be between approximately 0.25 microns and 1.50 microns. Larger or smaller depths of openings 32 may be formed, however, depending on the thicknesses of hardmask layer 28 and isolation structures 22.

Figure 4:
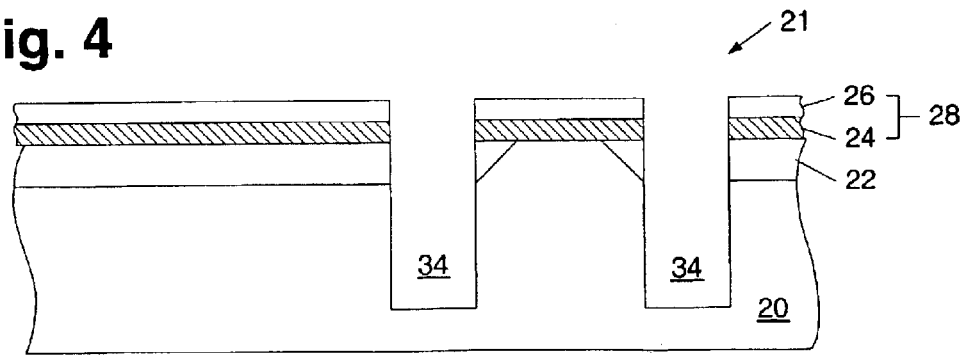
FIG. 4 depicts a partial cross-sectional view of the semiconductor topography in which trenches are etched into the semiconductor layer in alignment with the openings subsequent to the formation of the openings in FIG. 3.

The method of fabricating the relatively deep isolation structures may continue with etching the exposed portions of semiconductor layer 20 as shown in FIG. 4 to form trenches 34. In some embodiments, resist 30 may be removed prior to such an etching process. In this manner, the etching processes used to etch openings 32 and trenches 34 may be distinct. In particular, hardmask layer 20 may be used to pattern trenches 34. More specifically, the etching process used to etch trench 34 may be selective to semiconductor layer 20 while being substantially non-selective to hardmask layer 28. In other embodiments, resist 30 may be removed subsequent to the etching process of trenches 34. In such an embodiment, opening 32 and trenches 34 may, in some cases, be etched consecutively without an intervening pause or process step. In other cases, however, the etching processes of openings 32 and trenches 34 may be distinct in such an embodiment.

In either case, the overall depth of trenches 34 may be defined by the depth of trenches 34 within semiconductor layer 20 and the thickness of hardmask layer 28 and isolation structures 22. In some cases, an upper portion of hardmask layer 28, such as upper layer 26, may be removed subsequent to the formation of trenches 34. Embodiments including such a fabrication step are described in more detail below in reference to FIGS. 11–15. In such a case, the overall depth of trenches 34 may be defined the depth of trenches 34 within semiconductor layer 20, the remaining thickness of hardmask layer 28, and the thickness of isolation structures 22. In some embodiments, he depth of trenches 34 within semiconductor layer 20 may be between approximately 4.0 microns and approximately 8.0 microns, or more specifically approximately 6.5 microns. As such, the total depth of trenches 34 extending from the upper surface of hardmask layer 28 may be between approximately 4.25 microns and approximately 9.50 microns. In a preferred embodiment, the overall depth of trenches 34 may be between approximately 6.0 microns and approximately 8.0 microns. In any case, larger or smaller depths of trenches 34 within semiconductor layer 20 and overall depths of trenches 34 may be fabricated, depending on the design specifications of the device.

Figure 5:
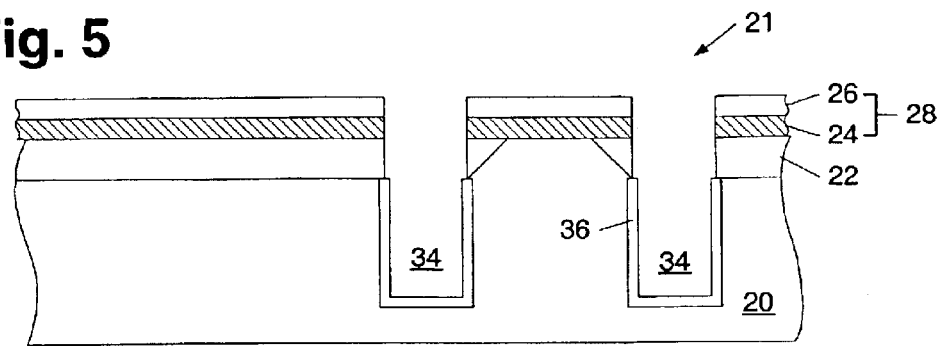
FIG. 5 depicts a partial cross-sectional view of the semiconductor topography in which oxide liner layers are formed within the trenches subsequent to the formation of the trenches in FIG. 4.

Subsequent to the fabrication of trenches 34, semiconductor topography 21 may be oxidized to form oxide liner layer 36 along the sidewalls and bottom surfaces of trenches 34 as shown in FIG. 5. Such an oxide liner layer may be used to insulate material subsequently deposited within trenches 34 as described below in reference the formation of lower and upper trench portions 40 and 44 depicted in FIGS. 7 and 9. "Liner layer," as described herein may refer to a layer which outlines the contour of a trench without filling the trench. More specifically, "liner layer" may refer to a layer which lines the sidewalls of a trench without merging the layer at the lateral center of the trench. "Fill layer," on the other hand, may refer to a layer which is deposited within a trench such that the trench is filled or nearly filled. More specifically, "fill layer" may refer to a layer deposited at a sufficient thickness to converge the material at the lateral center of the trench. In a preferred embodiment, oxide liner layer 36 may be thermally grown such that the liner layer is exclusively formed along the portions of trenches 34 comprising semiconductor layer 20 as shown in FIG. 5. In an alternative embodiment, oxide liner layer 36 may be deposited such that the liner layer covers the entirety of semiconductor topography 21, including the bottom surfaces and the entirety of the sidewalls of trenches 34 as well as surfaces of hardmask layer 28 adjacent to trenches 34.

In either embodiment, oxide liner layer 36 may include a thickness between approximately 50 angstroms and approximately 1500 angstroms. In embodiments in which no additional liner layers are subsequently formed within trenches 34, it may be advantageous to form oxide liner layer 36 to a thickness between approximately 1000 angstroms and approximately 1500 angstroms. In this manner, the fill layer subsequently deposited within trenches 34 may be adequately insulated. However, in cases in which additional liner layers are subsequently formed within trenches 34, it may be advantageous to restrict the thickness of oxide liner layer 36 to be between approximately 50 angstroms and approximately 150 angstroms such that the combined thickness of the liner layers is not greater than the width of trenches 34. An example of a method incorporating the deposition of multiple liner layers is described in more detail below in reference to FIGS. 14 and 15.

In other embodiments, the thickness of oxide liner layer 36 may not depend on whether additional liner layers are formed within the trenches. In particular, the thickness of oxide liner layer 36 may, in some cases, be less than approximately 1000 angstroms, or more specifically less than approximately 150 angstroms, in cases in which additional layers are not subsequently formed within trenches 34. In addition, the thickness of oxide liner layer 36 may, in some embodiments, be greater than approximately 1000 angstroms in cases in which additional liner layers are subsequently formed within trenches 34. Moreover, thicknesses greater than approximately 1500 angstroms or less than approximately 50 angstroms may be appropriate for oxide liner layer 36 in either embodiment, depending on the design specifications of the device.

The restriction of oxide liner layer 36 to have a thickness less than approximately 150 angstroms, in some embodiments, may also reduce the amount of high temperature processing used for the fabrication of the device. "High temperature processing" as used herein may refer to any fabrication process step that requires the topography to be exposed to a temperature greater than approximately 600° C. For example, the growth of oxide liner layer 36 during a thermal oxidation process may expose semiconductor topography 21 to temperatures greater than approximately 1000° C. for an extended period of time in order to obtain a desired thickness greater than approximately 1000 angstroms. Such an exposure to high temperatures may cause impurities within the layers and structures of the topography to diffuse. For example, impurities within buried layers of bipolar transistors may diffuse upon exposure of high temperature processing of the device. Restricting the growth of oxide liner layer 36 to less than approximately 150 angstroms, however, may significantly reduce the thermal exposure of semiconductor topography 21 during the fabrication process. As a result, impurities in layers of devices may diffuse less, improving the performance of the devices.

Figure 6:
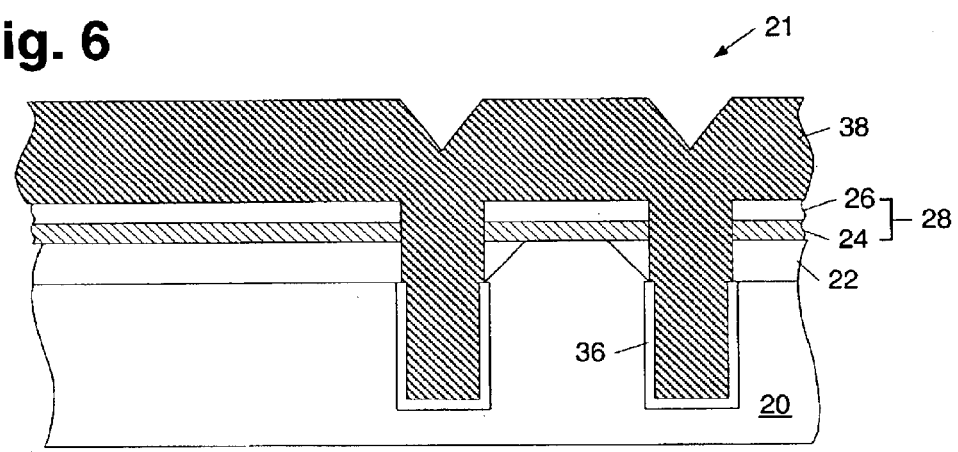
FIG. 6 depicts a partial cross-sectional view of the semiconductor topography in which a first fill layer is deposited within the trenches subsequent to the formation of the oxide liner layers of FIG. 5.

Turning to FIG. 6, trenches 34 may be filled with fill layer 38. In addition, fill layer 38 may be formed upon portions of hardmask layer 28 arranged adjacent to trenches 34. In a preferred embodiment, fill layer 38 may include a material with different etching characteristics than that of hard mask layer 28. In particular, fill layer 38 may include a material with different etch characteristics than that of lower layer 24 and/or upper layer 26. In this manner, fill layer 38 may be subsequently etched at a different rate than lower layer 24 and/or upper layer 26. In some embodiments, fill layer 38 may include a silicon material such as, amorphous silicon or undoped polysilicon, for example. As noted above, "fill layer", as used herein, may refer to a layer deposited at a sufficient thickness to converge the material at the lateral center of the trench.

Figure 7:
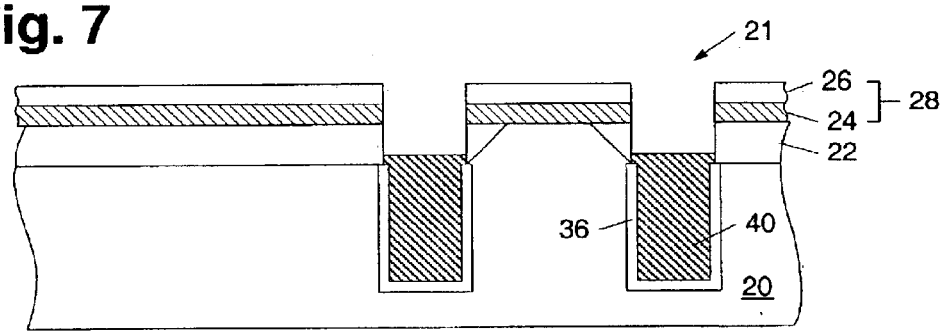
FIG. 7 depicts a partial cross-sectional view of the semiconductor topography in which the first fill layer is etched back subsequent to the deposition of the first fill layer in FIG. 6.

As such, fill layer 38 may be deposited upon semiconductor topography 21 such that the entirety of the upper surface of fill layer 38 is spaced above hardmask layer 28 in some cases. In other embodiments, however, fill layer 38 may be deposited upon semiconductor topography 21 such that the upper surface of fill layer 38 within trenches 34 is below the upper surface of hardmask layer 28. In either case, fill layer 38 is preferably etched back such that the upper surface of fill layer 38 within trenches 34 is below hardmask layer 28 and no remaining portions are arranged upon hardmask layer 28. Such a configuration forms lower trench portions 40 as shown in FIG. 7. In some cases, fill layer 38 may be etched back such that the upper surface fill layer 38 within trenches 34 is above the lower surface of isolation structures 22. In other cases, however, fill layer 38 may be etched back such that the upper surface of fill layer 38 within trenches 34 is substantially coplanar or lower than the lower surface of isolation structures 22.

In general, such an etch back process may include dry or wet etch techniques known in the semiconductor fabrication industry. In some embodiments, it may be preferable to retain at least a portion of hardmask layer 28 within semiconductor topography 21 after etching back fill layer 38. In particular, it may be advantageous to retain at least a portion of hardmask layer 28 for subsequent processing as described in more detail below in reference to FIG. 9. As such, the etch chemistry used for etching back fill layer 38 is preferably selective to the material of fill layer 38 over the material of upper layer 26 and/or lower layer 24. In this manner, fill layer 38 may be etched at a faster rate than the material included in upper layer 26 and/or lower layer 24 and thus, upper layer 26 and/or lower layer 24 may be retained within semiconductor topography 21. For example, in an embodiment in which upper layer 26 includes silicon dioxide and fill layer 38 includes amorphous silicon, an etch chemistry including $CF_4$, $C_2H_2F_6$, or HBr may be used. Other etch chemistries known for selective etching in the semiconductor fabrication industry may also be used, depending on the materials included in fill layer 38 and hardmask layer 28. Although FIG. 7 illustrates the retention of upper layer 26 subsequent to the etch back process of fill layer 38, the etch back process may, in some embodiments, remove some or all of upper layer 26. In such an embodiment, fill layer 38 may have substantially different etch characteristics than lower layer 24.

Figure 8:
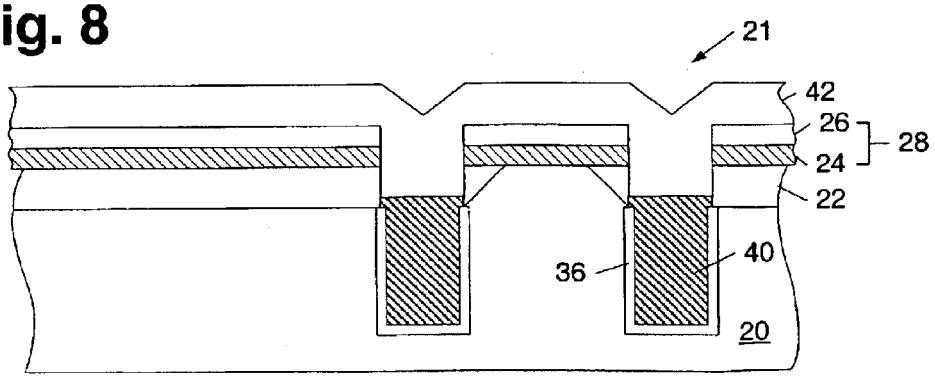
FIG. 8 depicts a partial cross-sectional view of the semiconductor topography in which a second fill layer is deposited within the trenches subsequent to the etch back of the first fill layer in FIG. 7.

Subsequent to the formation of lower trench portions 40, the vacant upper portion of trenches 36 may be filled with fill layer 42 as shown in FIG. 8. In general, fill layer 42 may include a dielectric material such that a lateral isolation structure extending through isolation structures 22 may be fabricated. Consequently, fill layer 42 may include, in some embodiments, silicon dioxide ($SiO_2$) or silicon oxynitride ($SiO_xN_y$ (Hz)). In addition, fill layer 42 may be doped or undoped. For example, in some cases, fill layer 42 may include low doped borophosphorus silicate glass (BPSG), low doped phosphorus silicate glass (PSG), or fluorinated silicate glass (FSG). Alternatively, fill layer 42 may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide.

In any embodiment, fill layer 42 may preferably include a material having different polishing and/or etching characteristics than a lower layer of hardmask layer 28. In this manner, an upper portion of fill layer 42 may be removed during subsequent processing while lower layer 24 of hardmask layer 28 may serve as either an etch stop layer or a polish stop layer. In some embodiments, fill layer 42 may include a material having substantially similar polishing and/or etching characteristics as an upper layer of hardmask layer 28. In particular, in an embodiment in which upper layer 26 is retained within the semiconductor topography 21 for the deposition of fill layer 42, fill layer 42 may include a material having substantially similar polishing and/or etching characteristics as upper layer 26. In this manner, fill layer 42 and upper layer 26 may be etched or polished at substantially the same rate in a subsequent processing step. As a result, fill layer 42 may, in some embodiments, be formed to be substantially coplanar with lower layer 24 of hardmask layer 28. Consequently, fill layer 42 may, in some embodiments, be formed upon semiconductor topography 21 of FIG. 8 such that the entirety of the upper surface of fill layer 42 is spaced above hardmask layer 28. In this manner, portions of fill layer 42 arranged above hardmask layer 28 and trenches 34 may be removed to form upper trench portions 44 as shown in FIG. 9. More specifically, an upper portion fill layer 42 may be removed such that remaining portions of fill layer 42 are laterally confined by sidewalls of trenches 34. As a result, semiconductor topography 21 may include relatively deep isolation regions recessed within a portion of isolation structures 22 and an underlying portion of semiconductor layer 20.

In some embodiments, such a removal process may include polishing portions of fill layer 42, by polishing techniques such as chemical-mechanical polishing or fixed abrasive polishing. In other embodiments, the removal of an upper portion of fill layer 42 may include etching the upper portion of the fill layer. Such an etch process may include either wet or dry etch techniques known in the semiconductor fabrication industry. In either case, the polishing process or etch chemistry used in the removal process is preferably selective to the material of fill layer 42 over the material of lower layer 24. In this manner, fill layer 42 may be removed at a faster rate than lower layer 24, and as a result, lower layer 24 may serve as either a polish stop layer or an etch stop layer depending on the method of removal. For example, in an embodiment in which fill layer 42 includes silicon dioxide and lower layer 24 include silicon nitride, an etch chemistry including $CF_4$, $C_2H_2F_6$, or HBr may be used for the removal process. Other etch chemistries known for selective etching in the semiconductor fabrication industry may also be used, depending on the materials included in fill layer 42 and lower layer 24. As noted above, in embodiments in which upper layer 26 is retained within semiconductor topography 21 for the deposition of fill layer 42, fill layer 42 may include a material having similar etch and/or polishing characteristics as upper layer 26. As such, upper layer 26 and adjacent portions of fill layer 42 arranged within trenches 34 may be etched or polished simultaneously such that a surface having portions of fill layer 42 substantially coplanar with lower layer 24 may be obtained.

FIG. 10 illustrates the removal of the remaining portions of lower layer 24 to expose isolation structures 22. Such a removal of lower layer 24 may be conducted by wet or dry etch techniques. Preferably, the removal of the remaining portions of lower layer 24 is selective to lower layer 24 over fill layer 42 of upper trench portions 44. For example, in an embodiment in which lower layer 24 includes silicon nitride and fill layer 42 includes silicon dioxide, the etch chemistry used to remove remaining portions of lower layer 24 may include $CF_4$, $C_2H_2F_6$, or HBr. In this manner, the removal of lower layer 24 may not remove a significant amount of upper trench portions 44. More specifically, the process of removing lower layer 24 may be adapted such that upper trench portions 44 may not have an upper surface below the upper surface of isolation structures 22. Such a selectivity of the removal of lower layer 24 may allow upper trench portions 44 to have step heights, which are the portions of upper trench portions 44 residing above the upper surface of isolation structures 22.

In this manner, lower layer 24 may serve as a step-definition layer. More specifically, the thickness of the step heights of upper trench portions 44 may depend on the thickness of lower layer 24. In some embodiments, the step heights of upper trench portions 44 may be equal to or less than the thickness of lower layer 24. For example, in some cases, the step height of upper trench portions 44 may be approximately 500 angstroms or less. More specifically, the step heights of upper trench portions 44 may be between approximately 300 angstroms and 500 angstroms and in preferred embodiments, approximately 400 angstroms. Larger or smaller thicknesses of step heights for upper trench portions 44, however, may be formed, depending on the design specifications of the device. Alternatively, the upper surface of upper trench portions 44 may be formed to be substantially coplanar with isolation structures 22 such that no step heights are formed.

FIG. 10 also illustrates the formation of a bipolar transistor between the deep isolation structures comprising upper and lower trench portions 44 and 40. In particular, FIG. 10 illustrates emitter region 52 formed above base region 50 and collector region 48. In addition, FIG. 10 illustrates buried layer 46 arranged below collector region 48. Typically, buried layer 46 may be formed within the semiconductor layer 20 prior to the formation of isolation structures 22. However, in other embodiments, buried layer 46 may be omitted from the fabrication device and, therefore, has been omitted from FIGS. 1–9. Such an omission of buried layer 46 in such figures, however, does not preclude for the formation of such a buried layer in the embodiments described in FIGS. 1–9. As noted above, in conventional devices, high substrate capacitance may be generated in transistors that have a buried layer. In particular, high substrate capacitance may be generated between the buried layer and isolation structures of a conventional device. Such high substrate capacitance may undesirably reduce the maximum frequency of operation of the device. In the device shown in FIG. 10, however, the deep isolation structures comprising upper and lower trench portions 44 and 40 may reduce or eliminate such a generation of high substrate capacitance, thereby improving the performance and reliability of the device. In particular, the inclusion of lower trench portion 40 may serve to isolate the region of semiconductor topography between buried layer 42 and isolation structures 22.

Figure 13:
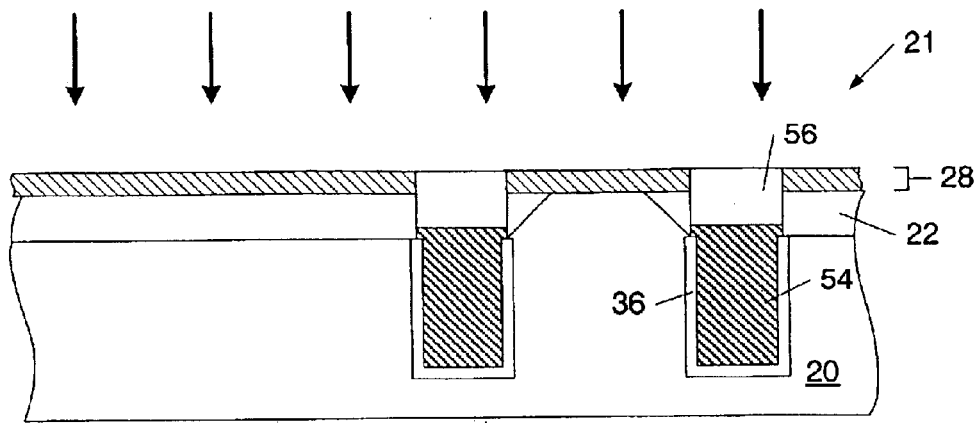
FIG. 13 depicts a partial cross-sectional view of the semiconductor topography in which an upper portion of the fill layer arranged within the trenches is oxidized subsequent to the formation of the fill layer within the trenches in FIG. 11.

FIGS. 11–13 illustrate yet another embodiment of the method described herein for fabricating a relatively deep isolation structure. In particular, FIG. 11 illustrates semiconductor topography 21 subsequent to the formation of trenches 34 in FIG. 4. As shown in FIG. 11, upper layer 26 of hardmask layer 28 may be removed subsequent to the formation of trenches 34. Such a removal process may be performed by wet or dry etch techniques known in the semiconductor fabrication industry. In alternative embodiments, upper layer 26 may be removed subsequent to the deposition of one or more materials within trenches 34 as described above in reference to FIGS. 5–9. In either case, oxide liner layer 36 may be formed within trenches 34 as shown in FIG. 12. In particular, oxide liner layer 36 may be formed within trenches 34 in a similar manner to the formation of oxide liner 36 described in reference to FIG. 5. For example, in some embodiments, oxide liner layer 36 may be thermally grown such that the liner layer is exclusively formed along the portions of trenches 34 comprising semiconductor layer 20 as shown in FIG. 12. In an alternative embodiment, oxide liner layer 36 may be deposited such that the liner layer covers the entirety of the sidewalls of trenches 34 as well as surfaces of semiconductor topography 21 adjacent to trenches 34. In either embodiment, oxide liner layer 36 may include a thickness between approximately 50 angstroms and approximately 1500 angstroms. Larger or smaller thicknesses of oxide liner layer 36, however, may be appropriate, depending on the design specifications of the device.

In addition, FIG. 12 illustrates the formation of trench portions 54 within trenches 34 and, more specifically upon oxide liner layer 36. Such a formation of trench portions 54 may include the deposition of a fill layer within trenches 34 and above adjacent portions of hardmask layer 28. Similar to the material of fill layer 38 in FIG. 6, the fill layer may include a material with different polishing and/or etching characteristics than that of hard mask layer 28. In particular, the fill layer may include a material with different polishing and/or etching characteristics than that of lower layer 24. For example, the fill layer may include a silicon material such as, amorphous silicon or undoped polysilicon. In a preferred embodiment, the fill layer may be deposited upon semiconductor topography 21 such that the entirely of the upper surface of the fill layer is spaced above hardmask layer 28. In this manner, portions of the fill layer arranged above hardmask layer 28 and trenches 34 may be removed to form upper trench portions 54 as shown in FIG. 12. More specifically, an upper portion of the fill layer may be removed such that remaining portions of the fill layer are laterally confined by sidewalls of trenches 34. As a result, semiconductor topography 21 may include relatively deep isolation regions recessed within a portion of isolation structures 22 and an underlying portion of semiconductor layer 20.

In some embodiments, the removal process of the upper portion of the fill layer used to form trench portions 54 may include polishing portions of the fill layer by techniques, such as chemical-mechanical polishing or fixed abrasive polishing. In other embodiments, the removal of the upper portion of the fill layer may include etching the upper portion of the fill layer. Such an etch process may include either wet or dry etch techniques known in the semiconductor fabrication industry. In either case, the polishing process or etch chemistry used in the removal process is preferably selective to the material of the fill layer over the material of lower layer 24. In this manner, an upper portion of the fill layer may be removed at a faster rate than lower layer 24, and as a result, lower layer 24 may serve as either a polish stop layer or an etch stop layer depending on the method of removal. For example, in an embodiment in which the fill layer includes silicon dioxide and lower layer 24 include silicon nitride, an etch chemistry including $CF_4$, $C_2H_2F_6$, or HBr may be used for the removal process. Other etch chemistries known for selective etching in the semiconductor fabrication industry may also be used, depending on the materials included in the fill layer and lower layer 24. In embodiments in which upper layer 26 is retained within semiconductor topography 21 for the deposition of the fill layer, the fill layer 42 may include a material having similar etch and/or polishing characteristics as upper layer 26. As such, upper layer 26 and adjacent portions of the fill layer may be etched or polished simultaneously such that a surface having trench portions 54 may be formed substantially coplanar with lower layer 24.

Subsequent to the formations of trench portions 54, semiconductor topography 21 may be oxidized to form oxidized portions 56 within trench portions 54. Such an oxidation process is illustrated by the arrows in FIG 13. In some embodiments, the oxidation process may be adapted to form oxidized portions 56 at a thickness which approximately equal to the thickness of isolation structures 22. In yet other embodiments, the oxidation process may be adapted to form oxidized portions 56 to a thickness that is substantially less or greater than the thickness of isolation structures 22. In either case, a lateral isolation structure extending through portions of isolation structures 22 may be fabricated by the oxidation process. As a result, semiconductor topography 21 may include relatively deep isolation structures recessed within a portion of isolation structures 22 and an underlying portion of semiconductor layer 22. In some cases, such an embodiment of semiconductor topography 21 may be further processed by removing remaining portions of lower layer 24 and forming a transistor between the fabricated deep isolation structures. Such subsequent processes may be similar to the fabrication steps described above in reference to FIG 10.

Figure 14:
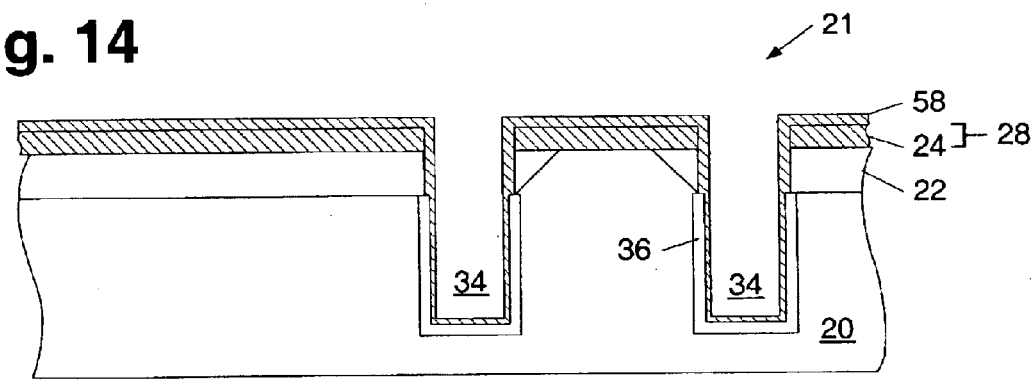
FIG. 14 depicts a partial cross-sectional view of the semiconductor topography, in an alternative embodiment, in which two liner layers are formed within the trenches subsequent to the removal of the upper portion of the hardmask layer in FIG. 11.
Figure 15:
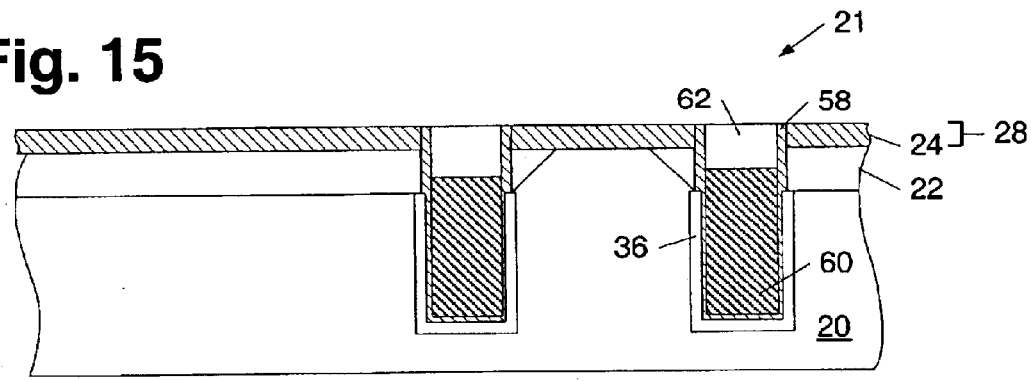
FIG. 15 depicts a partial cross-sectional view of the semiconductor topography in which the trenches have been filled subsequent to the formation of the two liner layers in FIG. 14.

Another embodiment for the method described herein is further illustrated in FIGS. 14 and 15. In particular, FIG. 14 illustrates semiconductor topography 21 subsequent to the removal of upper layer 26 in FIG. 11. Alternatively, the method described in FIGS. 14 and 15 may be used with a topography in which upper layer 26 has been retained for the deposition of material within trenches 34. Similar to the process described in FIG. 5, oxide liner layer 36 may be formed along the sidewalls of trenches 34 as shown in FIG. 14. For example, in some embodiments, oxide liner layer 36 may be thermally grown such that the liner layer is exclusively formed along the portions of trenches 34 comprising semiconductor layer 20. In an alternative embodiment, oxide liner layer 36 may be deposited such that the liner layer covers the entirety of the sidewalls of the trenches 34 as well as surfaces of semiconductor topography 21 adjacent to trenches 34. In contrast to the embodiment shown in FIG. 5, however, the embodiment of FIGS. 14–15 includes forming additional liner layer 58 upon oxide liner layer 36 prior to the deposition of a fill layer within trenches 34. In order to allow enough lateral space within trenches 34 for additional liner layer 58, oxide liner layer 36 may be formed with a smaller thickness than the embodiments in which an additional liner layer is not included in trenches 34. Consequently, oxide liner layer 36 may include a thickness between approximately 50 angstroms and approximately 150 angstroms, or more specifically between approximately 100 angstroms and approximately 125 angstroms. Larger or small thicknesses of oxide liner layer 36 may be used, however, depending on the width of trenches 36.

As shown in FIG. 14, additional liner layer 58 may be formed above lower layer 24 and along the base and the entirety of the sidewalls of trenches 34. In general, additional liner layer 58 may include any material which is adapted to insulate the one or more fill layers subsequently deposited within trenches 34. For example, in some embodiments, additional liner layer 58 may include a nitride material, such as silicon nitride or Bis(tert-butylamino) silane (BTBAS) nitride. In some embodiments, the use of BTBAS nitride may be particularly advantageous since the deposition of such a layer typically requires relatively low temperatures (i.e., less than approximately 600° C.). Consequently, semiconductor topography 21 may be subjected to less high temperature processing than a topography fabricated without the inclusion of BTBAS nitride. Such a reduction in high temperature processing may prevent or reduce the diffusion of impurities within the topography. For example, a fabrication sequence which incorporates the formation of BTBAS nitride liner layers within deep isolation trenches which are adapted to isolate subsequently formed bipolar transistors may prevent or reduce the amount of impurities diffused from, for example, the buried layers of the bipolar transistors. In any case, additional liner layer 58 may include a thickness between approximately 800 angstroms and approximately 1500 angstroms, or more specifically, between approximately 1000 angstroms and approximately 1200 angstroms. However, larger or smaller thicknesses may be used for additional liner layer 58, depending on the design specifications of the device.

Subsequent to the formation of additional liner layer 58, one or more fill layers may be deposited within trenches 34 such that a relatively deep isolation trench may be formed. More specifically, lower trench portion 60 and upper trench portion 62 may be formed within trenches 34 as shown in FIG. 15. Such a formation of the lower and upper trench portions may be similar to the methods described in FIGS. 6–9 and 12–13. In particular, the formation of lower trench portion 60 may include depositing a silicon fill layer within trenches 34 and etching it back such that upper trench portion 62 may be formed by the deposition and planarization of a dielectric fill layer. Such a method is described in more detail above in reference to FIGS. 6–9. Alternatively, lower trench portion 60 and upper trench portion 62 may be formed by depositing and planarizing a single fill layer within trenches 34. In such an embodiment, the distinction between lower trench portion 60 and upper trench portion 62 may be produced by oxidizing an upper portion of the fill layer within trenches 34 as described above in reference to FIGS. 12 and 13.

In either case, the upper surface of the relatively deep isolation region may be formed by removing portions of additional liner layer 58 arranged upon hardmask layer 28. In this manner, the substantially coplanar surface between the upper surface of upper trench portion 62 and the upper surface of hardmask layer 28 may include the upper surface of additional liner layer 58 as shown in FIG. 15. Semiconductor topography 21 may be further processed in a similar manner to FIGS. 9 and 10 subsequent to the removal of the portion of additional hardmask layer 58 arranged upon hardmask layer 28. In particular, remaining portions of lower layer 24 may be removed from semiconductor topography 21 and a transistor may be formed between the fabricated deep isolation structures.

It will be appreciated to those skilled in the art having the benefit of this disclosure that this invention is believed to provide a method for processing a semiconductor topography and more particularly, forming relatively deep isolation structures. Further modifications and alternative embodiments of various aspects of the invention will be apparent to those skilled in the art in view of this description. For example, although discussed above with reference to isolation structures formed within a semiconductor layer, the method described herein may be useful in other applications which include the formation of deep structures within a layer. In particular, the method described herein may be used for the formation of other isolation structures within a device which are not formed within a semiconductor layer. In addition, the method may be used for fabricating a deep contact structure or via with multiple materials formed therein. The method described herein may, therefore, form deep structures for applications other than for embodiments which form isolation structures within semiconductor layers as described above. It is intended that the following claims be interpreted to embrace all such modifications and changes and, accordingly, the drawings and the specification are to be regarded in an illustrative rather than a restrictive sense.

What is claimed is:

1. A method for processing a semiconductor topography, comprising:
   forming an isolation structure within a semiconductor layer of the semiconductor topography;
   forming a hardmask layer above the isolation structure and the semiconductor layer; and
   etching an opening within the hardmask layer and isolation such that an underlying portion of the semiconductor layer is exposed.

2. The method recited in claim 1, further comprising etching the underlying portion of the semiconductor layer to form a trench extending through the hardmask layer, the isolation structure and at least part of the semiconductor layer.

3. The method recited in claim 2, further comprising forming an oxide liner layer along the part of the semiconductor layer comprising the trench.

4. The method recited in claim 3, further comprising depositing a Bis(tert-butylamino)silane (BTBAS) nitride liner layer within the trench and adjacent regions of the semiconductor topography subsequent to the step of forming the oxide liner layer.

5. The method recited in claim 2, further comprising:
   depositing a fill layer within the trench;
   removing part of the fill layer such that an upper surface of the fill layer is substantially coplanar with an upper surface of the hardmask layer; and
   oxidizing an upper portion of the fill layer arranged within the trench.

6. The method recited in claim 5, further comprising removing an upper portion of the hardmask layer prior to the step of depositing the fill layer.

7. The method recited in claim 2, further comprising:
   depositing a first fill layer within the trench; and
   etching back the first fill layer such that an upper surface of the first fill layer is below an upper portion of the trench.

8. The method recited in claim 7, further comprising:
   depositing a second fill layer upon the first fill layer; and
   removing part of the second fill layer to be substantially coplanar with an upper surface of the hardmask layer.

9. A method for forming an isolation structure, comprising:
   removing part of a fill layer deposited within a trench such that an upper surface of the fill layer is below an upper portion of the trench;
   forming a second layer within the upper portion of the trench; and
   removing part of the second layer such that an upper surface of the second fill layer is substantially coplanar with a hardmask layer arranged adjacent to the trench.

10. The method recited in claim 9, wherein the step of removing part of the second layer comprises polishing the second layer.

11. The method recited in claim 9, wherein the step of removing part of the second layer comprises etching the second layer.

12. A method for processing a semiconductor topography, comprising:

forming an isolation structure within a semiconductor layer of the semiconductor topography;

forming a hardmask layer above the isolation structure and the semiconductor layer; and etching an opening within the hardmask layer, isolation structure, and an underlying portion of the semiconductor layer to form a trench having a depth greater than approximately 3.0 microns.

13. The method of claim 12, wherein the trench comprises a depth between approximately 4.0 microns and approximately 8.0 microns extending through the isolation structure and the semiconductor layer.

14. The method of claim 12, further comprising:

depositing a fill layer within the trench;

removing part of the fill layer such that an upper surface of the fill layer is substantially coplanar with an upper surface of the hardmask layer; and oxidizing an upper portion of the fill layer arranged within the trench.

15. The method of claim 14, wherein the step of oxidizing comprises oxidizing an upper portion of the fill layer having a substantially similar thickness as the isolation structure.

16. The method recited in claim 12, further comprising:

depositing a first fill layer within the trench; and etching back the first fill layer such that an upper surface of the first fill layer is below an upper portion of the trench.

17. The method of claim 16, wherein the step of etching back the first fill layer comprises etching the first fill layer such that an upper surface of the first fill layer is above a lower surface of the isolation structure.

18. The method recited in claim 16, further comprising:

depositing a second fill layer upon the first fill layer; and removing part of the second fill layer to be substantially coplanar with an upper surface of the hardmask layer.

19. The method of claim 18, further comprising selectively removing the hardmask layer without substantially removing the second fill layer such that an upper surface of the second fill layer is above an upper surface of the isolation structure.

* * * * *

UNITED STATES PATENT AND TRADEMARK OFFICE
CERTIFICATE OF CORRECTION

PATENT NO. : 6,794,269 B1
DATED : September 21, 2004
INVENTOR(S) : Gopalan et al.

It is certified that error appears in the above-identified patent and that said Letters Patent is hereby corrected as shown below:

Title page,
Item [74], *Attorney, Agent, or Firm*, please delete "Mollie P. Jellang" and substitute therefor -- Mollie E. Lettang --.

Column 16,
Lines 14-15, please delete "isolation such" and substitute therefor -- isolation structure such --.

Signed and Sealed this

Eighth Day of February, 2005

JON W. DUDAS
*Director of the United States Patent and Trademark Office*